United States Patent
Huang

(10) Patent No.: US 10,666,233 B1
(45) Date of Patent: May 26, 2020

(54) POWER DROP RESET CIRCUIT FOR POWER SUPPLY CHIP AND POWER DROP RESET SIGNAL GENERATING METHOD

(71) Applicant: Winbond Electronics Corp., Taichung (TW)

(72) Inventor: Koying Huang, San Jose, CA (US)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 16/275,349

(22) Filed: Feb. 14, 2019

(51) Int. Cl.
*H03K 3/02* (2006.01)
*H03K 3/012* (2006.01)
*H03K 5/02* (2006.01)
*H03K 19/21* (2006.01)

(52) U.S. Cl.
CPC .............. *H03K 3/012* (2013.01); *H03K 5/02* (2013.01); *H03K 19/21* (2013.01)

(58) Field of Classification Search
CPC .. H03K 3/012; H03K 3/02337; H03K 3/0375; H03K 5/02; H03K 5/2481; H03K 5/249; H03K 5/08; H03K 5/153; H03K 17/30; H03K 17/58; H03K 17/223; H03K 17/22; H03K 19/21; G06F 1/24
See application file for complete search history.

(56) References Cited

U.S. PATENT DOCUMENTS

| 8,692,593 | B1* | 4/2014 | Zhang | G06F 1/30 327/142 |
| 2005/0140405 | A1* | 6/2005 | Do | H03K 17/223 327/143 |
| 2013/0265838 | A1 | 10/2013 | Li | |
| 2014/0077842 | A1* | 3/2014 | Zhang | G06F 1/30 327/72 |

FOREIGN PATENT DOCUMENTS

| CN | 105281726 | 1/2016 |
| TW | 201626375 | 7/2016 |

* cited by examiner

*Primary Examiner* — Long Nguyen
(74) *Attorney, Agent, or Firm* — JCIPRNET

(57) ABSTRACT

The disclosure is directed to a power drop reset circuit which includes not limited to: a first step circuit configured to detect a change of a power supply voltage per unit of time and transmit an enable signal in response to the first step circuit having determined that the change of the power supply voltage per unit of time has dropped below zero, wherein the first step circuit does not consume any current when the Vcc change per unit of time is greater than or equal to zero; and a second step circuit electrically connected to the first step circuit and configured to detect the Vcc in response to having received the enable signal and generate a power drop reset signal in response to having determined that the Vcc has dropped below a predetermined operating voltage, wherein the second step circuit consumes an operating current after receiving the enable signal.

20 Claims, 9 Drawing Sheets

POWER DROP RESET CIRCUIT FOR POWER SUPPLY CHIP AND POWER DROP RESET SIGNAL GENERATING METHOD

TECHNICAL FIELD

The present disclosure is directed to a power drop reset circuit used by a power supply chip and a power drop reset signal generating method.

BACKGROUND

Conventionally, a power on reset (POR) circuit is used to generate a power on reset signal for a power supply chip and to trigger a power up read signal which is for reading status bits in order to obtain the current status information of the power supply chip. A system wide reboot could be triggered after the bias voltage (Vcc) of the power supply chip drops to an operating voltage that is below a predetermined Vcc operating voltage but above the ground voltage. The POR circuit is used by a power supply chip which normally is not allowed to consume current while the power supply chip is in a standby mode, but a power drop may nevertheless occur while the power supply chip is in the standby mode. Since characteristics of a realistic power supply chip may not match the characteristics of an ideal power supply chip, the POR mechanism might not function as intended.

FIG. 1A illustrates triggering of an POR signal of an ideal POR circuit. According to FIG. 1, it is assumed that the lowest Vcc operating voltage level 111 is predetermined and is shown as the dotted line. As the Vcc voltage ramps up, when Vcc voltage reaches the lowest Vcc operating voltage level 111 at a first time point 101, a POR will occur at the first time point 101. When the Vcc operating voltage drops below the lowest Vcc operating voltage level 111 at a second time point 102, the power supply chip will set the POR circuit to be ready for a POR. When the Vcc operating voltage goes back up and exceeds the lowest Vcc operating voltage at a third time point 103, the POR will occur at the third time point. However, a realistic POR circuit might not match such characteristics.

FIG. 1B shows the characteristics of a real POR signal generated by a typical POR circuit of a power supply chip. It is assumed that the lowest Vcc operation voltage level 111 is predetermined and is shown as the dotted line. Realistically, it might be possible that the POR reset voltage at the fourth time point 104 is actually lower than the lowest Vcc operation voltage level 111. Also, the Vcc might not drop low enough in order for the POR circuit to be set for a POR. Such problem is further described in FIG. 1C.

Referring to FIG. 1C, it is assumed that the lowest Vcc operating voltage level is predetermined and is shown as the dotted line. As the Vcc voltage ramps up, when Vcc voltage exceeds the lowest Vcc operating voltage level 111 at a fifth time point 105, a POR will occur around the first time point 105, but the voltage at which the POR occur might be lower than the lowest Vcc operating voltage level 111. When the Vcc operating voltage drops below the lowest Vcc operating voltage at a sixth time point 106, the power supply chip will set the POR circuit to be ready for a POR. When the Vcc operating voltage goes back up and exceeds the lowest Vcc operating voltage at a seventh time point 107, the POR will occur around the seventh time point. However, the power supply chip setting the POR circuit to be ready for a POR at the sixth time point 106 might not actually happen because realistically, the Vcc operating voltage might not drop far enough below the lowest Vcc operating voltage level 111. As such, the POR around the seventh time point also would not occur.

The above described problems could be summarized as follows. First, it is not easy to have the Vcc operating voltage exactly meeting the intended voltage in order for the POR to occur. Second, the Vcc operating voltage might not drop far enough below the lowest Vcc operating voltage level. Third, it is not easy to design the POR circuit because the POR circuit should consume just about no current when the power supply chip is at a standby mode. Based on the above considerations, the POR circuit may still require improvements.

SUMMARY OF THE DISCLOSURE

In order to address the above described problems, the disclosure is directed to a power drop reset circuit and a power drop reset generating method thereof.

In one of the exemplary embodiments, the disclosure is directed to a power drop reset circuit which includes not limited to: a first step circuit configured to detect a decrease of a power supply voltage and to transmit an enable signal in response to the first step circuit having detected the decrease of the power supply voltage, wherein the first step circuit does not consume any current when the power supply voltage is increasing or is remaining constant; and a second step circuit electrically connected to the first step circuit and configured to detect the power supply voltage in response to having received the enable signal and generate a POR signal in response to having determined that the power supply voltage has dropped below a predetermined operating voltage, wherein the second step circuit consumes an operating current after receiving the enable signal.

In one of the exemplary embodiments, the disclosure is directed to a power drop reset signal generating method used by a power supply chip. The method would include not limited to: using a first step circuit to detect whether a decrease of a power supply voltage has occurred, wherein the first step circuit does not consume any current when the power supply voltage is increasing or is remaining constant; transmitting, by the first step circuit, an enable signal in response to the first step circuit having detected that the power supply voltage has decreased; using a second step circuit to detect whether the power supply voltage has dropped below a predetermined operating voltage in response to having received the enable signal, wherein the second step circuit consumes an operating current after receiving the enable signal; and generating a power drop reset signal in response to having detected that the power supply voltage has dropped below the predetermined operating voltage.

In order to make the aforementioned features and advantages of the present disclosure comprehensible, exemplary embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the present disclosure and is therefore not meant to be limiting or restrictive in any manner. Also the present disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1A:
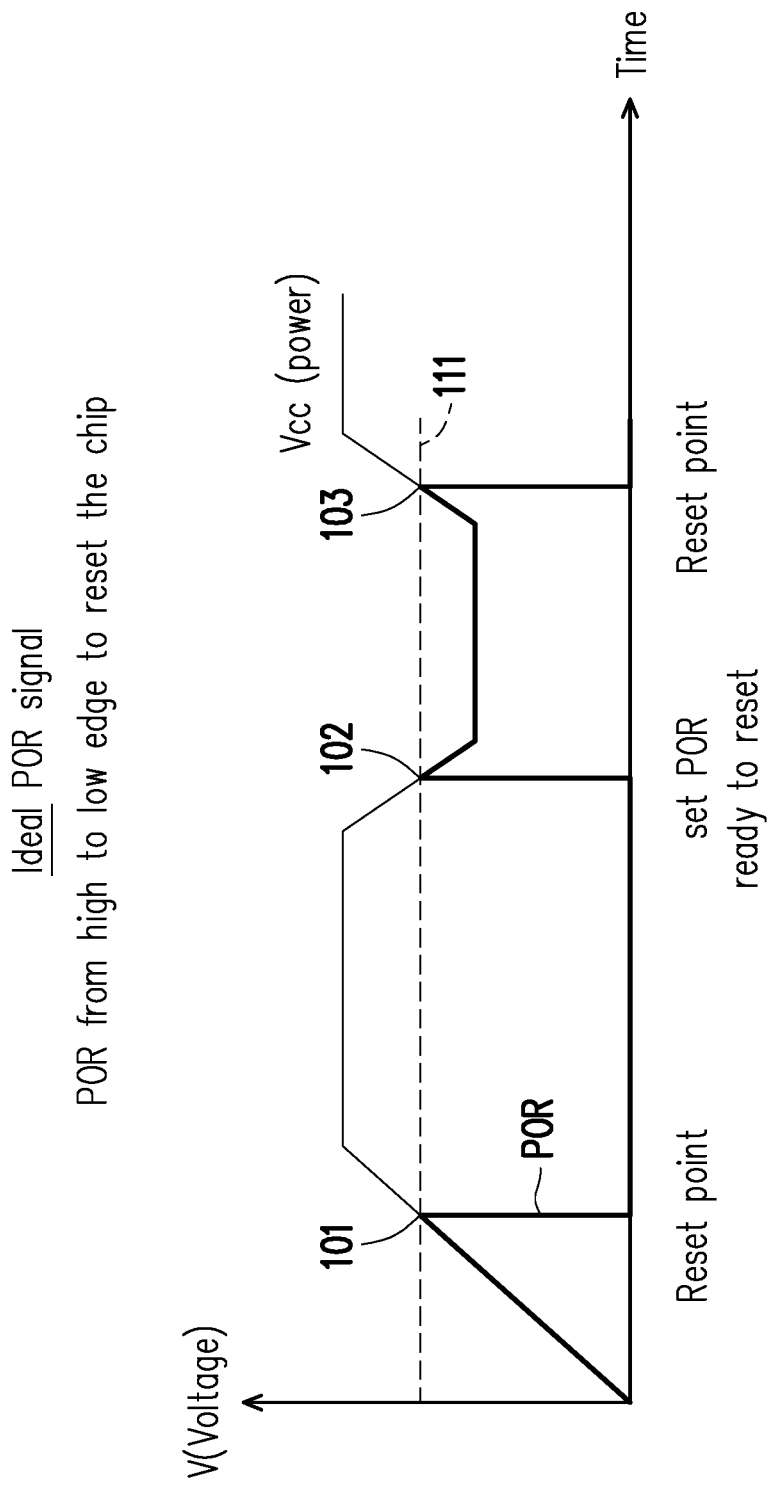
FIG. 1A illustrates triggering of a POR signal of an ideal POR circuit.

Reference will now be made in detail to the present exemplary embodiments of the disclosure, examples of which are illustrated in the accompanying drawings. Wherever possible, the same reference numbers are used in the drawings and the description to refer to the same or like parts.

Figure 2:
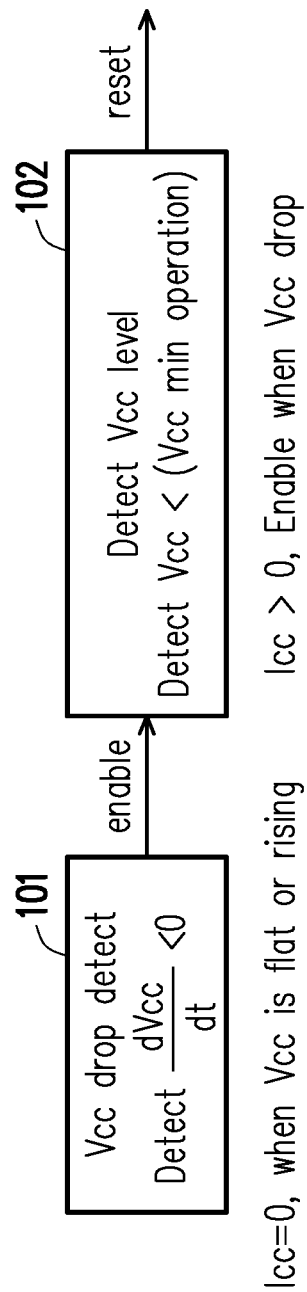
FIG. 2 illustrates a functional block diagram of a POR circuit in accordance with one of the exemplary embodiments of the disclosure.

In order to address some or all of the above described problems, the disclosure provides a power drop reset circuit used by a POR circuit of a power supply chip and a power drop reset signal generating method. FIG. 2 illustrates a functional block diagram of a power drop reset circuit with power drop detection mechanism in accordance with one of the exemplary embodiments of the disclosure. The power drop reset circuit would include not limited to a first step circuit 201 and a second step circuit 202 which is connected to the first step circuit. The power drop reset circuit could be a part of a POR circuit of a power supply chip and would generate a reset signal to reset the power supply chip which could be a part of an electronic device.

The first step circuit 201 is configured to detect whether there is a decrease of a power supply voltage (i.e. Vcc). In response to having detected a decrease of a power supply voltage, the first step circuit 201 would transmit to the second step circuit 202 an enable signal. The decrease of the power supply voltage could be defined as the change of the power supply voltage per unit of time is less than zero (i.e. Vdcc/dt<0). It is worth noting that the first step circuit 201 should consume practically no current when the power supply voltage is increasing or is remaining constant.

The second step circuit 202 is electrically connected to the first step circuit 201 and is configured to detect the power supply voltage level in response to having received the enable signal. The second step circuit 202 would generate a power drop reset signal in response to having determined that the power supply voltage has dropped below a predetermined operating voltage (e.g. 111). It is worth noting that the second step circuit 202 does consume an operating current when the power supply voltage decreases after receiving the enable signal.

Basically, the first step circuit 201 and the second step circuit 202 will output a power drop reset signal which will reset the power supply chip when the power supply voltage decrease has been detected and has subsequently drop below a predetermined voltage (i.e. minimum power supply voltage level). The first step circuit 201 would generate an enable signal upon detecting a decrease of the power supply voltage, and the enable signal will activate the second step circuit to output a power drop reset signal when the power supply voltage has dropped below a predetermined voltage. The first step circuit 201 does not consume any current when the power supply voltage is increasing or is remaining constant, and the power supply voltage detection would be more accurate since the second step circuit 202 does consume current. The power drop reset voltage would reset the power supply chip and restore status bits just like a power up read which a power supply chip normally performs.

Figure 3:
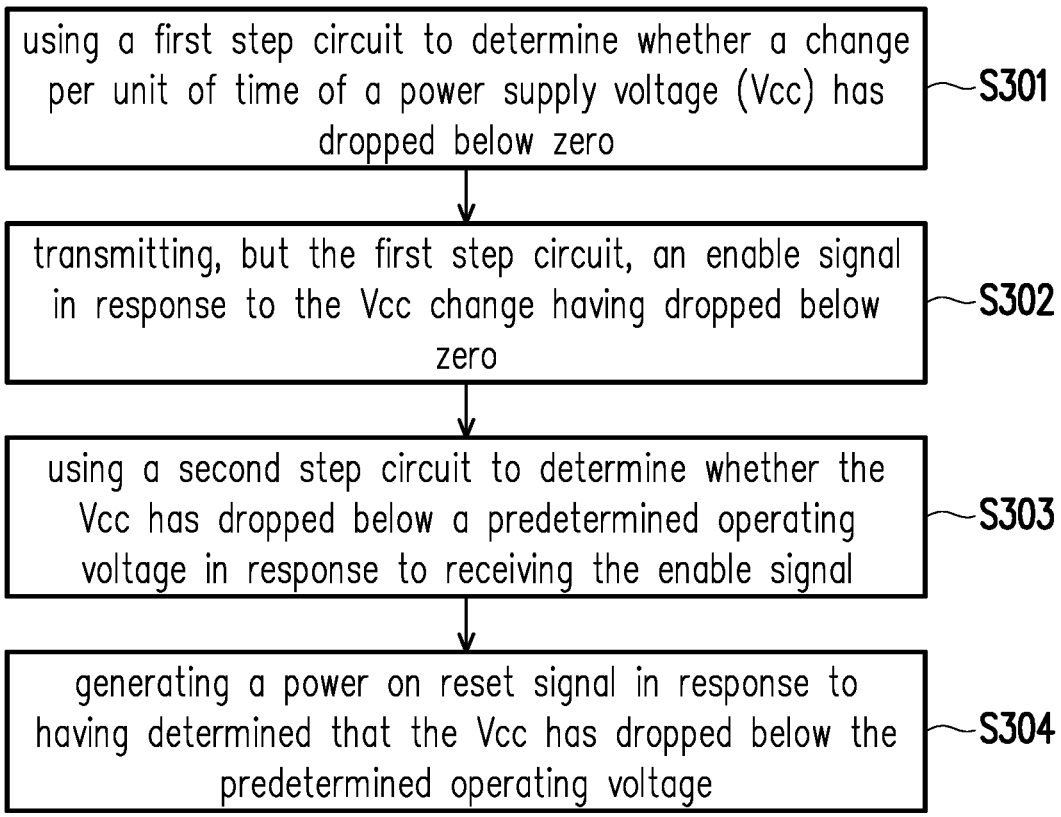
FIG. 3 illustrates a flow chart of a power drop reset signal generating method used by a power supply chip in accordance with one of the exemplary embodiments of the disclosure.

FIG. 3 illustrates a flow chart of a power drop reset signal generating method used by a power supply chip in accordance with one of the exemplary embodiments of the disclosure. In step S301, a first step circuit of a power drop reset circuit would detect whether a decrease of a power supply voltage has occurred. The first step circuit does not consume any current when the power supply voltage is increasing or is remaining constant. In step S302, the first step circuit would transmit an enable signal in response to the first step circuit having detected that the decrease of the power supply voltage has occurred. In step S303, a second step circuit of a power drop reset circuit would detect whether the power supply voltage has dropped below a predetermined operating voltage in response to having received the enable signal. The second step circuit consumes an operating current after receiving the enable signal. In step S304, the second step circuit would generate a power drop reset signal in response to having determined that the power supply voltage has dropped below the predetermined operating voltage.

Figure 4:
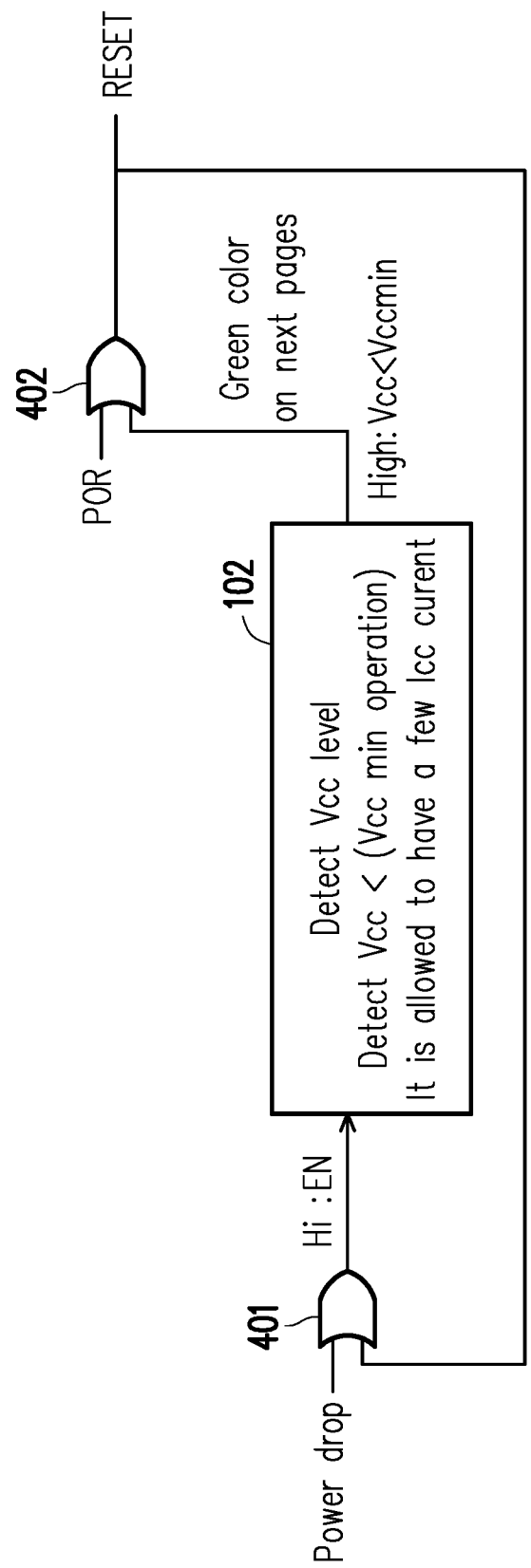
FIG. 4 illustrates an embodiment of the second step circuit in accordance with one of the exemplary embodiments of the disclosure.

FIG. 4 illustrates an embodiment of the second step circuit in accordance with one of the exemplary embodiments of the disclosure. In addition to the second step circuit of 202 of FIG. 3, the second step circuit 202 may further include a first OR gate 401 which receives the power drop detect signal and the power drop reset signal to generates the enable signal. The second step circuit 202 would receive the enable signal if either the first step circuit 201 has detected a decrease of the power supply voltage or the voltage drop reset signal has been generated. The second step circuit may further include a second OR gate 402 which receive the output of the second step circuit 402 and a POR signal and generates the power drop reset signal. The power drop reset signal would be generated in response to either receiving the POR signal or a detection result which indicates that the power supply voltage has dropped below the predetermined operating voltage. The second step circuit 202 would consume the operating current after receiving the enable signal and the detection result which indicates that the power supply voltage has dropped below the predetermined operating voltage.

Figure 5:
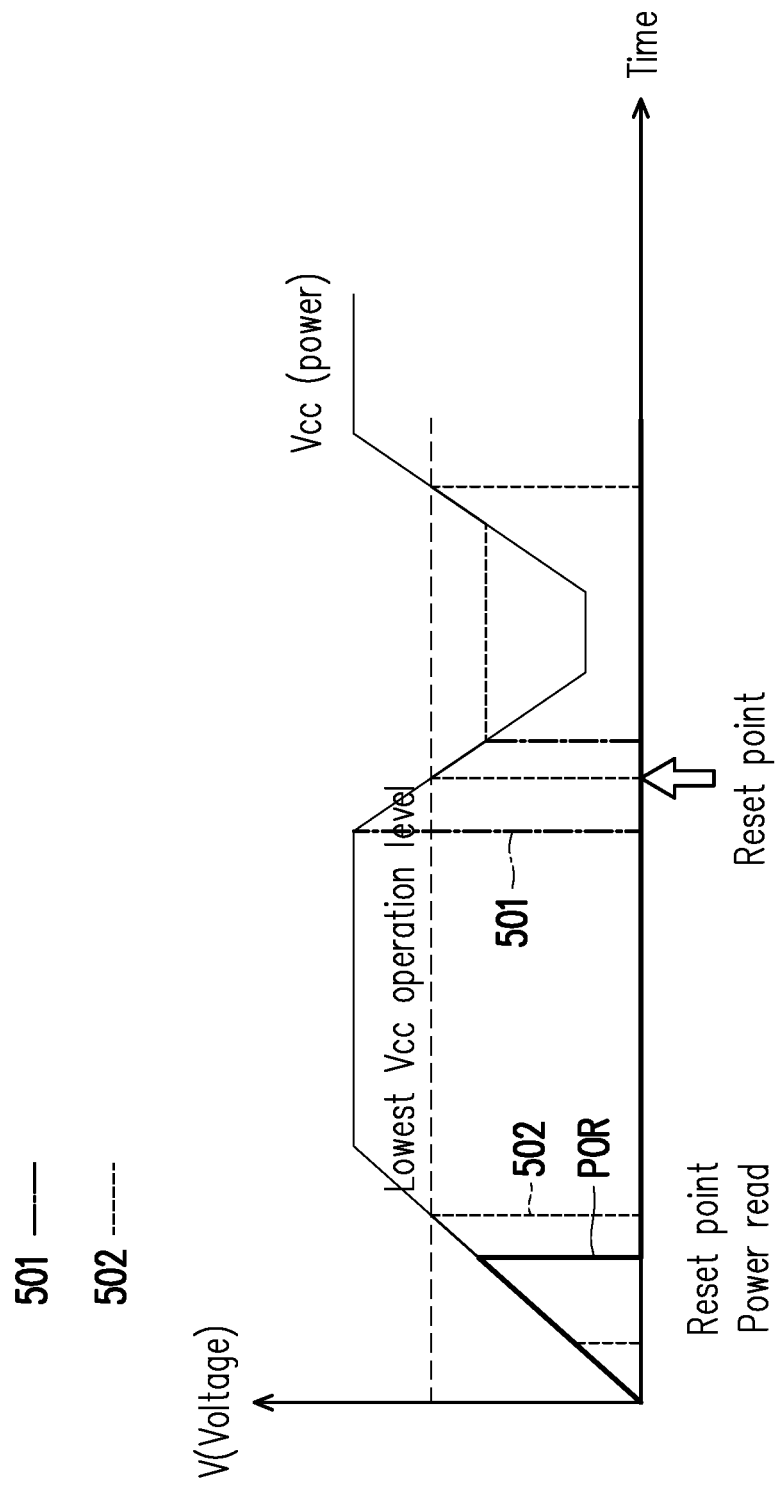
FIG. 5 is a timing diagram which illustrates the generation of the power drop reset signal in accordance with one of the exemplary embodiments of the disclosure.

FIG. 5 is an example which illustrates the generation of the power drop reset signal in accordance with one of the exemplary embodiments of the disclosure. As shown in the example of FIG. 5, the first step circuit 201 would be triggered to output the enable signal which enables the second step circuit 202 during the part 501 when the power supply voltage is decreasing, and the second step circuit 202 would output a second voltage signal 502 which generate a power drop reset signal and restores the status bits for the power supply chip as shown in the part 502 when the power supply voltage has dropped below the minimum power supply operating voltage. The reset point occurs just as the power supply voltage has dropped below the minimum power supply operating voltage.

Figure 1B:
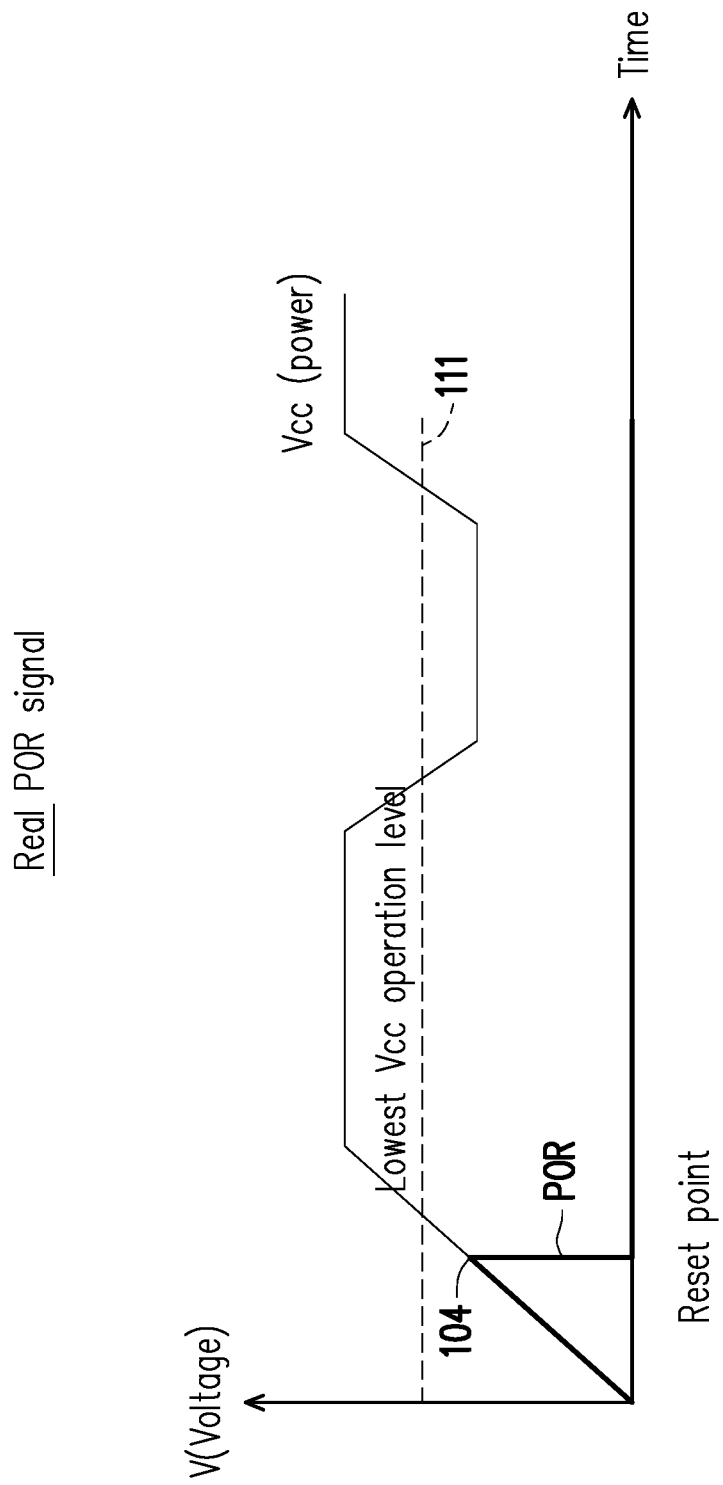
FIG. 1B illustrates triggering of a POR signal of a realistic POR circuit.
Figure 1C:
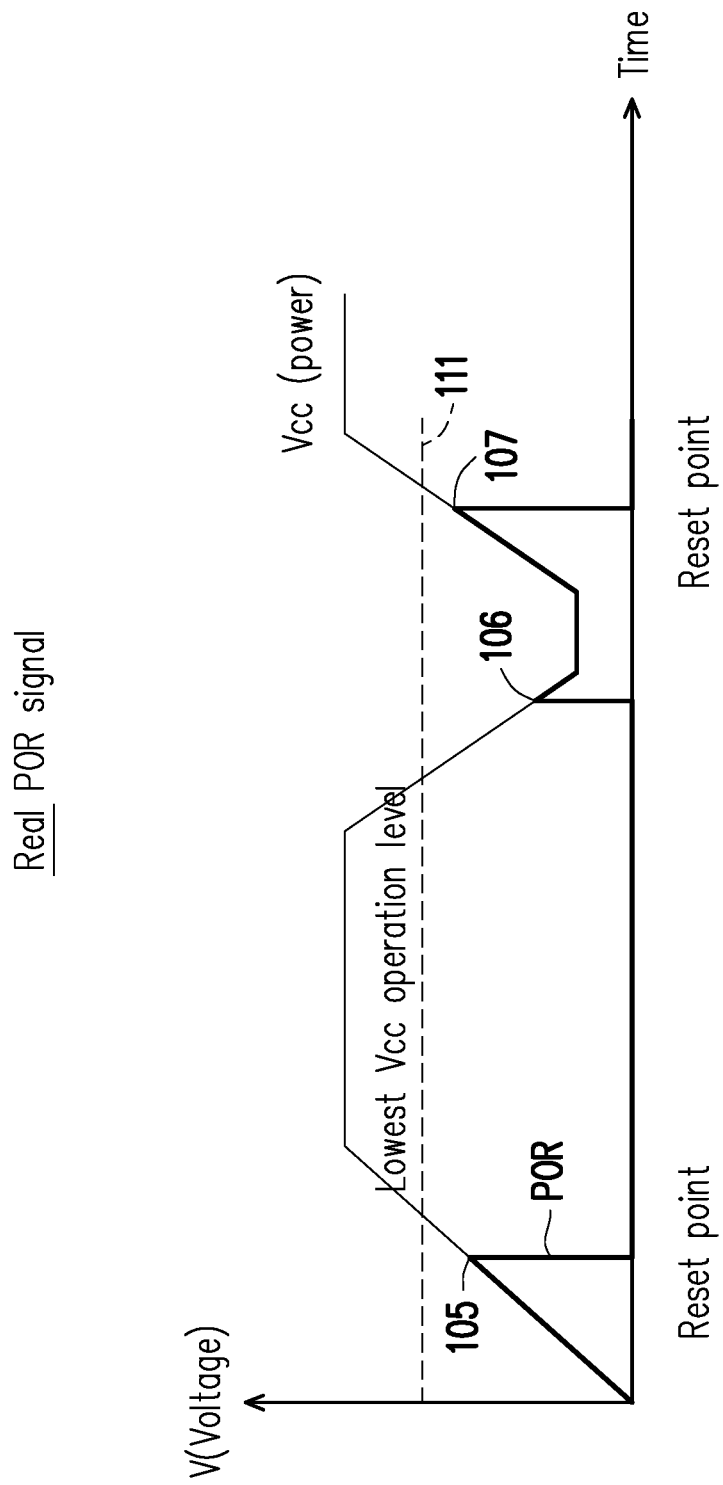
FIG. 1C illustrates the shortcoming of a realistic POR signal.
Figure 6:
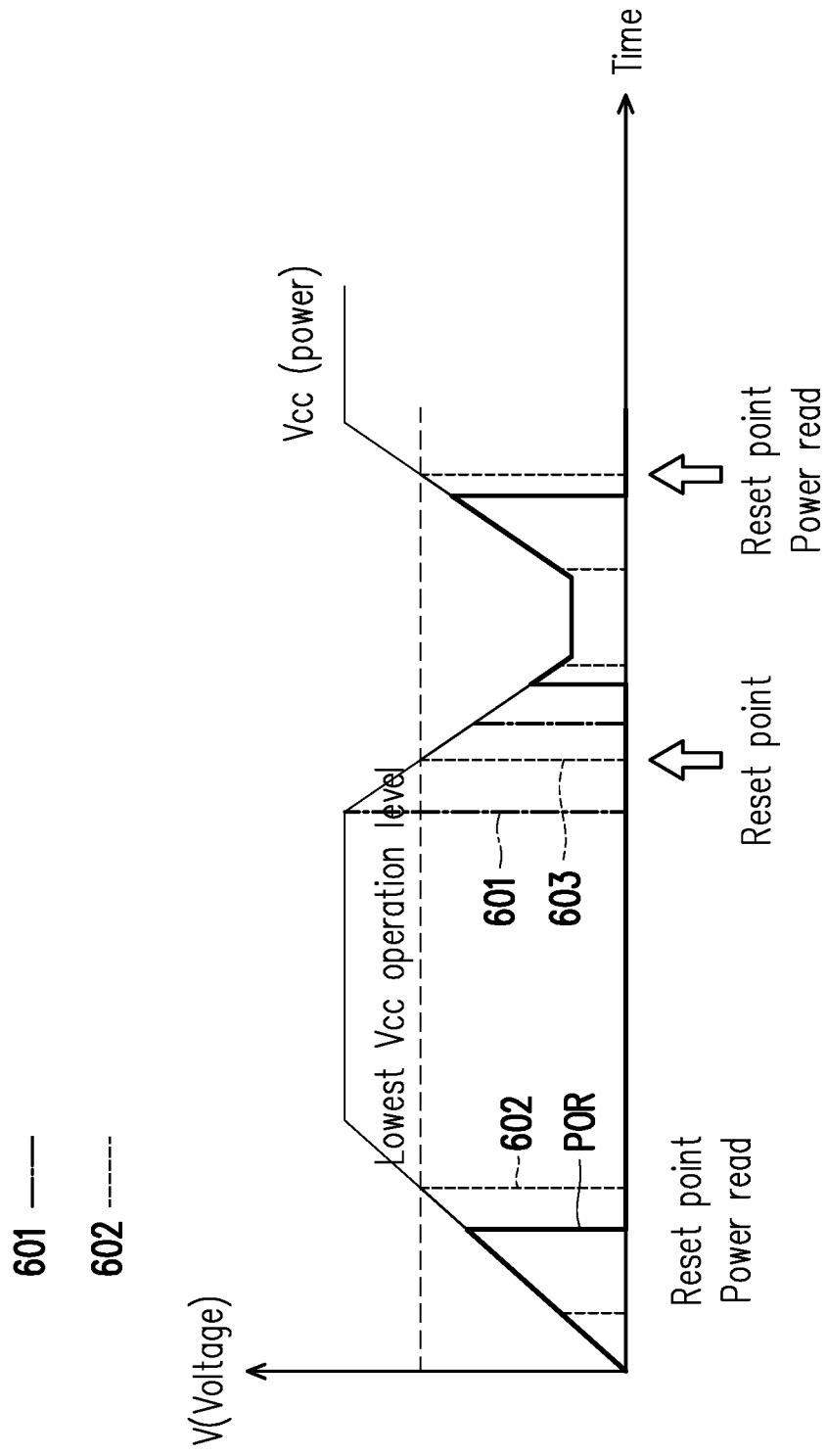
FIG. 6 is a timing diagram which illustrates the generation of the power drop reset signal in further details in accordance with one of the exemplary embodiments of the disclosure.

FIG. 6 is a timing diagram which illustrates the generation of the power drop reset signal in further details in accordance with one of the exemplary embodiments of the disclosure. As shown in the example of FIG. 6, the first step circuit 201 would be triggered to output the enable signal which enables the second step circuit 202 during the part 601 when the power supply voltage is decreasing, and the second step circuit 202 would output a second voltage signal 602 which generate a power drop reset signal and restores the status bits for the power supply chip as shown in the part 502 when the power supply voltage has dropped below the minimum power supply operating voltage. As the POR signal ramps up and reaches at a level just below the minimum power supply operating voltage, a power drop reset signal will cause a reset since there is an OR operation between the POR signal and the output of the second step circuit 202. The second step circuit 202 would cause the power drop reset signal to reset the power supply chip when the power supply voltage has dropped below the minimum power supply operating voltage even though the POR voltage is uncertain or has not dropped far enough. In this way, the problem of a realistic POR signal as described in FIG. 1B could be avoided and the POR reset mechanism would more likely accomplish its goal of reliably resetting the power supply chip even though no current has been consumed.

Figure 7:
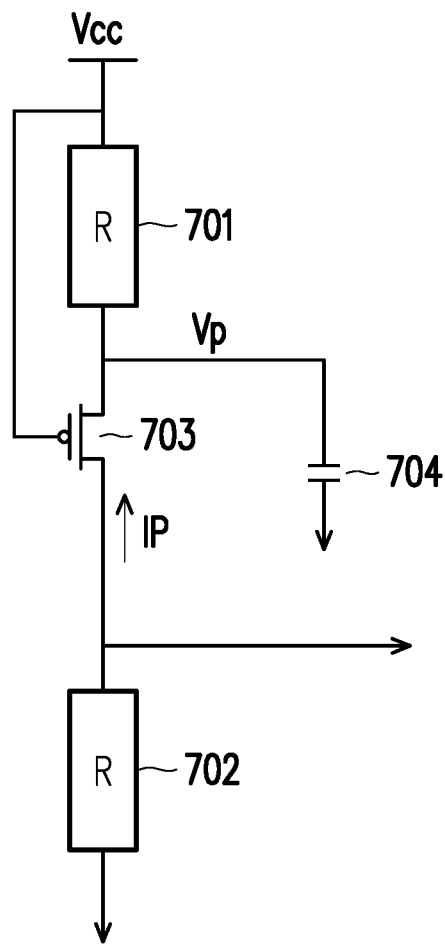
FIG. 7 illustrates an embodiment of the first step circuit in accordance with one of the exemplary embodiments of the disclosure.

FIG. 7 illustrates an embodiment of the first step circuit in accordance with one of the exemplary embodiments of the disclosure. The first step circuit 201 may include a first resistor 701 electrically connected to a transistor 703 which is connected to a second resistor 702. The transistor could be but not limited to a PMOS transistor for example. One of the terminals of the first resistor 701 is connected to the power supply voltage (Vcc) and the other terminal of the first resistor 701 is connected to a first terminal of the transistor which could be source terminal of a PMOS transistor. The gate terminal of the transistor 703 is connected to the power supply voltage, and a second terminal (e.g. drain terminal) of the transistor 703 is connected to the second resistor 702. The source terminal may further include a capacitor 704 which may serve as a filter for high frequency noise. The other terminal of second resistor 702 could be connected to ground or a reference voltage.

Assuming that the transistor 703 is a PMOS transistor, then in response to the decrease of the power supply voltage, the voltage of the source terminal of the transistor 703 could be greater than the power supply voltage at the moment when the power supply voltage (e.g. Vcc) decreases. The decrease power supply voltage could in turn cause a current across the transistor 703 and the second resistor 702 to increase so as to generate a power drop detect signal.

In view of the aforementioned descriptions, the present disclosure is suitable for being used in a power supply chip and is able to reliably generate a reset signal while consuming no current when the power supply voltage is stable or is rising.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A power drop reset circuit comprising:
a first step circuit configured to detect a decrease of a power supply voltage and transmit an enable signal in response to the first step circuit having detected the decrease of the power supply voltage, wherein the first step circuit does not consume any current when the power supply voltage is increasing or is remaining constant; and
a second step circuit electrically connected to the first step circuit and configured to detect the power supply voltage in response to having received the enable signal and generate a power drop reset signal in response to having determined that the power supply voltage has dropped below a predetermined operating voltage, wherein the second step circuit consumes an operating current after receiving the enable signal, wherein the first step circuit comprises a first resistor electrically connected to a transistor which is connected to a second resistor, wherein a first terminal of the first resistor is connected to the power supply voltage, a second terminal of the first resistor is connected to a first terminal of the transistor, a gate terminal of the transistor is connected to the power supply voltage, and a second terminal of the transistor is connected to the second resistor.

2. The power drop reset circuit of claim 1, wherein in response to the decrease of the power supply voltage, a voltage of the first terminal of the transistor is greater than the power supply voltage.

3. The power drop reset circuit of claim 1, wherein in response to the decrease of the power supply voltage, a current across the second resistor is increased so as to generate a power drop detect signal.

4. The power drop reset circuit of claim 1, wherein the second step circuit further comprising a first OR gate which receives a power drop detect signal and the power drop reset signal and generates the enable signal.

5. The power drop reset circuit of claim 1, wherein the second step circuit further comprising a second OR gate and generating the power drop reset signal in response to receive a power on reset signal and a detection result which indicates that the power supply voltage has dropped below the predetermined operating voltage.

6. The power drop reset circuit of claim 5, wherein the second step circuit consumes the operating current after receiving the enable signal comprising:
the second step circuit consumes the operating current in response to receiving the enable signal and the detection result which indicates that the power supply voltage has dropped below the predetermined operating voltage.

7. The power drop reset circuit of claim 1, wherein the first step circuit detects the decrease of the power supply voltage comprising:
detecting whether a change of the power supply voltage (Vcc) per unit of time (t) has dropped below zero.

8. The power drop reset circuit of claim 1, wherein the power drop reset circuit is coupled to a power on reset circuit and is disposed within a power supply chip.

9. The power drop reset circuit of claim 8, wherein the power drop reset signal restores status bits of the power supply chip.

10. A power drop reset signal generating method used by a power supply chip, the method comprising:
using a first step circuit to detect whether a decrease of a power supply voltage has occurred, wherein the first step circuit does not consume any current when the power supply voltage is increasing or is remaining constant;
transmitting, by the first step circuit, an enable signal in response to the first step circuit having detected that the decrease of the power supply voltage has occurred;
using a second step circuit to detect whether the power supply voltage has dropped below a predetermined operating voltage in response to having received the enable signal, wherein the second step circuit consumes an operating current after receiving the enable signal; and
generating a power drop reset signal in response to having determined that the power supply voltage has dropped below the predetermined operating voltage, wherein the first step circuit comprises a first resistor electrically connected to a transistor which is connected to a second resistor, wherein a first terminal of the first resistor is connected to the power supply voltage, a second terminal of the first resistor is connected to a first terminal of the transistor, a gate terminal of the transistor is connected to the power supply voltage, and a second terminal of the transistor is connected to the second resistor.

11. The power drop reset signal generating method of claim 10, wherein in response to the decrease of the power supply voltage, a voltage of the first terminal of the transistor is greater than the power supply voltage.

12. The power drop reset signal generating method of claim 10, wherein in response to the decrease of the power supply voltage, a current across the second resistor is increased so as to generate a power drop detect signal.

13. The power drop reset signal generating method of claim 10, wherein the second step circuit further comprising a first OR gate which receives a power drop detect signal and the power drop reset signal and generates the enable signal.

14. The power drop reset signal generating method of claim 10, wherein the second step circuit further comprising a second OR gate and generating the power drop reset signal in response to receive a power on reset signal and a detection result which indicates that the power supply voltage has dropped below the predetermined operating voltage.

15. The power drop reset signal generating method of claim 14, wherein the second step circuit consumes the operating current after receiving the enable signal comprising:
the second step circuit consumes the operating current in response to receiving the enable signal and the detection result which indicates that the power supply voltage has dropped below the predetermined operating voltage.

16. The power drop reset signal generating method of claim 10, wherein the first step circuit detects the decrease of the power supply voltage comprising:
detecting whether a change of the power supply voltage (Vcc) per unit of time (t) has dropped below zero.

17. The power drop reset signal generating method of claim 10, wherein the power drop reset circuit is coupled to a power on reset circuit and is disposed within a power supply chip.

18. The power drop reset signal generating method of claim 17, wherein the power drop reset signal restores status bits of the power supply chip.

19. A power drop reset circuit comprising:
a first step circuit configured to detect a decrease of a power supply voltage and transmit an enable signal in response to the first step circuit having detected the decrease of the power supply voltage, wherein the first step circuit does not consume any current when the power supply voltage is increasing or is remaining constant; and
a second step circuit electrically connected to the first step circuit and configured to detect the power supply voltage in response to having received the enable signal and generate a power drop reset signal in response to having determined that the power supply voltage has dropped below a predetermined operating voltage, wherein the second step circuit consumes an operating current after receiving the enable signal, wherein the second step circuit further comprising a second OR gate and generating the power drop reset signal in response to receive a power on reset signal and a detection result which indicates that the power supply voltage has dropped below the predetermined operating voltage.

20. The power drop reset circuit of claim 19, wherein the first step circuit comprises a first resistor electrically connected to a transistor which is connected to a second resistor, wherein a first terminal of the first resistor is connected to the power supply voltage, a second terminal of the first resistor is connected to a first terminal of the transistor, a gate terminal of the transistor is connected to the power supply voltage, and a second terminal of the transistor is connected to the second resistor.

* * * * *